United States Patent
Weng et al.

(10) Patent No.: US 10,510,830 B2
(45) Date of Patent: Dec. 17, 2019

(54) N-TYPE POLYSILICON CRYSTAL, MANUFACTURING METHOD THEREOF, AND N-TYPE POLYSILICON WAFER

(71) Applicant: Sino-American Silicon Products Inc., Hsinchu (TW)

(72) Inventors: Ching-Hung Weng, Hsinchu (TW); Cheng-Jui Yang, Hsinchu (TW); Yu-Min Yang, Hsinchu (TW); Yuan-Hsiao Chang, Hsinchu (TW); Bo-Kai Wang, Hsinchu (TW); Wen-Huai Yu, Hsinchu (TW); Ying-Ru Shih, Hsinchu (TW); Sung-Lin Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 0 days.

(21) Appl. No.: 16/120,300

(22) Filed: Sep. 2, 2018

(65) Prior Publication Data
US 2019/0096987 A1  Mar. 28, 2019

(30) Foreign Application Priority Data
Sep. 25, 2017  (TW) .............................. 106132853 A (51) Int. Cl.
*H01L 29/32* (2006.01)
*H01L 29/04* (2006.01)
(Continued)

(52) U.S. Cl.
CPC ............ *H01L 29/045* (2013.01); *C30B 11/00* (2013.01); *C30B 29/06* (2013.01); *H01L 29/04* (2013.01);
(Continued)

(58) Field of Classification Search
None
See application file for complete search history.

(56) References Cited

U.S. PATENT DOCUMENTS

| 2007/0186845 | A1* | 8/2007 | Umeno | ................... C30B 15/04 117/13 |
|---|---|---|---|---|
| 2011/0263126 | A1* | 10/2011 | Harada | ................. C30B 15/203 438/691 |

(Continued)

FOREIGN PATENT DOCUMENTS

| CN | 102312279 | 1/2012 |
| CN | 102560641 | 7/2012 |

(Continued)

OTHER PUBLICATIONS

Florian Schindler et al., "High-Efficiency Multicrystalline Silicon Solar Cells:Potential of n-Type Doping" IEEE Journal of Photovoltaics, vol. 5, No. 6, Nov. 2015, pp. 1571-1579.

(Continued)

*Primary Examiner* — Grant S Withers
(74) *Attorney, Agent, or Firm* — JCIPRNET (57) ABSTRACT

An N-type polysilicon crystal, a manufacturing method thereof, and an N-type polysilicon wafer are provided. The N-type polysilicon crystal has a slope of resistivity and a slope of defect area percentage. When the horizontal axis is referred to solidified fraction and the vertical axis is referred to resistivity presented by a unit of Ohm·cm (Ω·cm), the slope of resistivity is 0 to −1.8 at the solidified fraction of 0.25 to 0.8. When the horizontal axis is referred to solidified fraction and the vertical axis is referred to defect area percentage (%), the slope of defect area percentage is less than 2.5 at the solidified fraction of 0.4 to 0.8.

10 Claims, 5 Drawing Sheets

(51) Int. Cl.
  *H01L 29/167* (2006.01)
  *H01L 31/0368* (2006.01)
  *C30B 11/00* (2006.01)
  *C30B 29/06* (2006.01)

(52) U.S. Cl.
  CPC ............ *H01L 29/167* (2013.01); *H01L 29/32* (2013.01); *H01L 31/03682* (2013.01)

(56) References Cited

U.S. PATENT DOCUMENTS

2013/0161793 A1* 6/2013 Nakai .................... C30B 15/04
 257/607
2013/0277809 A1* 10/2013 Nakai .................... C30B 15/00
 257/627

FOREIGN PATENT DOCUMENTS

| | | |
|---|---|---|
| CN | 104532345 | 4/2015 |
| TW | 201708634 | 3/2017 |

OTHER PUBLICATIONS

Florian Schindler et al., "The Potential of Multicrystalline N-Type Silicon for High Efficiency Solar Cells" 29th European PV Solar Energy Conference and Exhibition, Sep. 22-26, 2014, pp. 1-5.

* cited by examiner

N-TYPE POLYSILICON CRYSTAL, MANUFACTURING METHOD THEREOF, AND N-TYPE POLYSILICON WAFER

CROSS-REFERENCE TO RELATED APPLICATION

This application claims the priority benefit of Taiwan application serial no. 106132853, filed on Sep. 25, 2017. The entirety of the above-mentioned patent application is hereby incorporated by reference herein and made a part of this specification.

BACKGROUND OF THE INVENTION

Field of the Invention

The invention relates to an N-type polysilicon crystal growth technique, and more particularly, to an N-type polysilicon crystal, a manufacturing method thereof, and an N-type polysilicon wafer.

Description of Related Art

A solar cell is an optoelectronic device generating electrical energy from absorbed sunlight via photovoltaic effect. Currently, the material of the solar cell is mainly based on silicon materials, such as single-crystal silicon, polysilicon, or amorphous silicon.

By using polysilicon as a raw material for a solar cell, the cost is significantly less than the cost of a solar cell using single crystal silicon manufactured via an existing Czochralski method (CZ) method and floating zone (FZ) method.

In general, polysilicon crystal growth is casting-based, and P-type polysilicon is mainly applied in the solar cell. However, P-type polysilicon does not compete well against single crystals in the market and fails to maintain market share because of low conversion efficiency. Therefore, development of an N-type polysilicon having significantly higher conversion efficiency is urgently needed.

However, resistance of current N-type polysilicon ingot is widely distributed, which leads to an issue of low production yield.

SUMMARY OF THE INVENTION

The invention provides an N-type polysilicon crystal having concentrated resistance distribution and great crystal quality.

The invention further provides an N-type polysilicon wafer having longer minority carrier lifetime.

The invention further provides a manufacturing method of an N-type polysilicon crystal that can produce a crystal having concentrated resistance distribution and great quality.

The N-type polysilicon crystal of the invention has a slope of resistivity and a slope of defect area percentage. When the horizontal axis unit is referred to a solidified fraction and the vertical axis is referred to the resistivity presented by a unit of Ohm·cm ($\Omega$·cm), the slope of resistivity is 0 to −1.8 at the solidified fraction of 0.25 to 0.8. When the horizontal axis is referred to the solidified fraction and the vertical axis is referred to the defect area percentage (%), the slope of defect area percentage is less than 2.5 at the solidified fraction of 0.4 to 0.8.

In an embodiment of the invention, the average value of minority carrier lifetime of the N-type polysilicon crystal measured via a μ-PCD (microwave photoconductivity decay) method is greater than 20 μs.

In an embodiment of the invention, the N-type polysilicon crystal is doped with gallium and phosphorous, and the doping amount of gallium is such as 0.3 ppma to 3 ppma, the doping amount of phosphorous is such as 0.02 ppma to 0.2 ppma, and the atomic ratio of gallium with respect to phosphorous is such as between 10 and 20.

In an embodiment of the invention, the N-type polysilicon crystal includes an ingot, a brick, or a wafer.

In an embodiment of the invention, a crystal orientation of the N-type polysilicon crystal at least includes {111}, {112}, {113}, {315}, and {115}.

In an embodiment of the invention, the defect area percentage of the N-type polysilicon crystal is less than 2% at the solidified fraction of 0.4 to 0.8.

In an embodiment of the invention, when the oxygen content of the N-type polysilicon crystal is in the range of greater than or equal to 5 ppma, the carbon content of the corresponding location thereof is greater than or equal to 4 ppma.

In an embodiment of the invention, the N-type polysilicon crystal includes a plurality of crystal grains grown along a crystal growth direction, wherein the average crystal grain size of the silicon crystal grains in the crystal growth direction and the resistivity of the N-type polysilicon crystal have opposite changing trends.

In an embodiment of the invention, the average crystal grain size can be less than or equal to 1.3 cm.

The N-type polysilicon crystal wafer of the invention is obtained via cutting the N-type polysilicon crystal described above, and the average value of minority carrier lifetime measured via a μ-PCD (microwave photoconductivity decay) method is 2 μs to 5 μs.

In the manufacturing method of the N-type polysilicon crystal of the invention, an N-type polysilicon crystal is grown using a crystal growth furnace of a directional solidification system (DSS), wherein a crucible in the crystal growth furnace contains a silicon material and a dopant, a height of the N-type polysilicon crystal is H, and the dopant is located in a region of 0.1 H to 0.3 H from a bottom portion of the crucible.

In another embodiment of the invention, the dopant includes a particle, a doping sheet, or a combination thereof.

In another embodiment of the invention, the dopant includes gallium and phosphorus.

In another embodiment of the invention, the doping amount of gallium is about 0.3 ppma to 3 ppma, the doping amount of phosphorous is about 0.02 ppma to 0.2 ppma, and the atomic ratio of gallium with respect to phosphorous is between about 10 and 20.

In another embodiment of the invention, the silicon material can include a waste wafer.

In another embodiment of the invention, the dopant is such as a particle, and the following steps can be further included before the N-type polysilicon crystal is grown. A portion of a silicon material is covered by the waste wafer, then the particle is placed on the waste wafer, and then the particle is surrounded and covered by the remainder of the silicon material.

In another embodiment of the invention, the dopant is, for instance, a particle and a doping sheet, and the following can be further included before the N-type polysilicon crystal is grown. A portion of a silicon material is covered using the waste wafer, then the particle is placed on the waste wafer, and then the particle is covered by another waste wafer.

Next, the doping wafer is placed on the another waste wafer on the particle, and the remainder of the silicon material is added.

Based on the above, in the invention, during the process of growing the N-type polysilicon crystal in a DSS crystal growth furnace, the dopant is placed in a region of a specific range, and therefore an N-type polysilicon crystal having concentrated resistance distribution and great quality can be manufactured. In addition, an N-type polysilicon wafer having great quality and longer minority carrier lifetime is obtained via cutting such N-type polysilicon crystal. Thus, the N-type polysilicon wafer can be made in a solar cell having better conversion efficiency than a solar cell prepared by a P-type polysilicon wafer.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The text above summarily described the figures of the invention, and better understanding can be attained via the detailed description of the invention below. Other technical features and advantages of the subject matters of the claims of the invention are described below. Those having ordinary skill in the art of the invention should understand that, the concepts and specific embodiments disclosed below can be used as a basis for modifying or designing other structures or processes to implement the same object as the invention. Those having ordinary skill in the art of the invention should also understand that, such equivalent construction cannot depart from the spirit and scope of the invention provided in the accompanying claims.

The disclosure below provides numerous different embodiments or examples for implementing different features of the invention. Descriptions of specific examples of devices and configurations are provided below, to simplify the disclosure of the invention. Of course, these are only examples, and are not intended to limit the scope and application of the invention. Moreover, for clarity, the relative thicknesses and locations of regions or structural devices may be reduced or enlarged. Moreover, similar or same reference numerals in each of the figures tend to indicate the presence of similar or same devices or features. Similar reference numerals in the figures represent similar devices and descriptions thereof are omitted.

Figure 1:
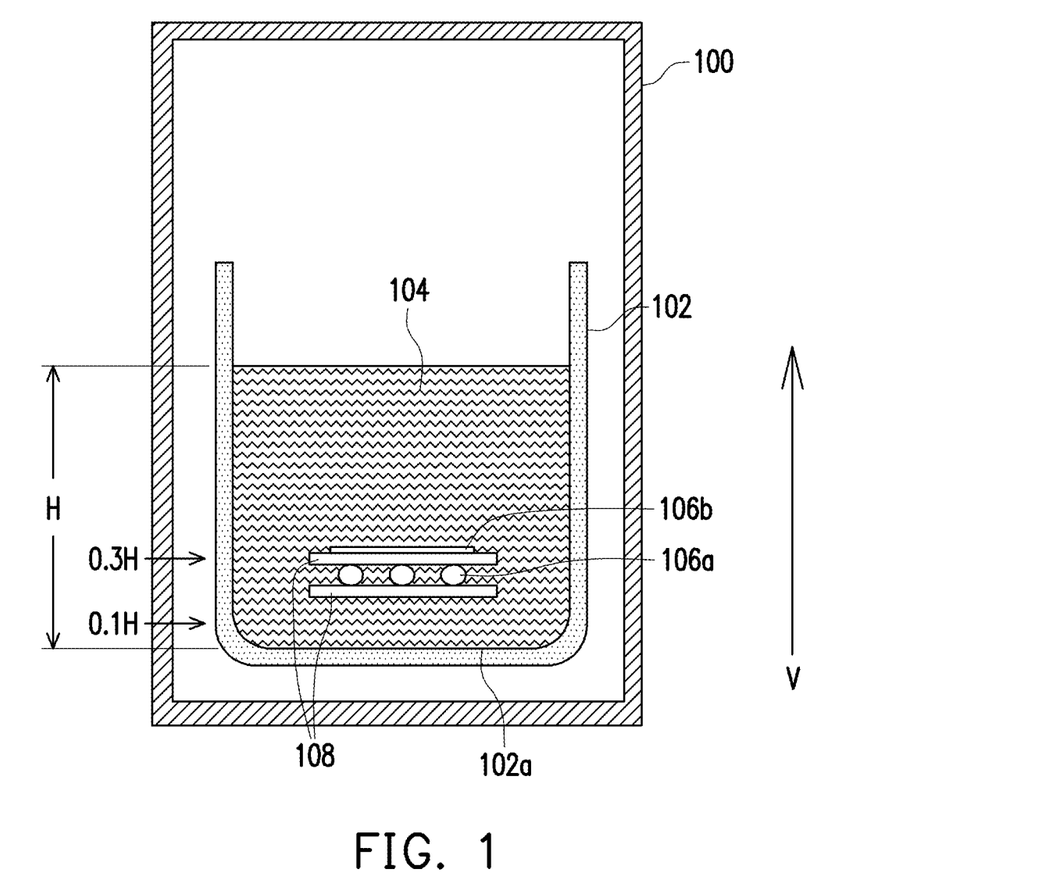
FIG. 1 is a schematic view illustrating preparation of an N-type polysilicon crystal according to a first embodiment of the invention.

FIG. 1 is a schematic view illustrating preparation of an N-type polysilicon crystal according to a first embodiment of the invention.

FIG. 1 shows a crucible 102 inside a crystal growth furnace 100 of a directional solidification system (DSS), and other components thereof are similar to those of known or existing DSS crystal growth furnaces.

In the present embodiment, the crucible 102 contains a silicon material 104 and dopants 106a and 106b. If the height of the N-type polysilicon crystal grown via DSS is H, then the locations of the dopants 106a and 106b need to be in a region of 0.1 H to 0.3 H from a bottom portion 102a of the crucible 102. In FIG. 1, the dopant 106a is a particle and the dopant 106b is a doping sheet, but in the invention, the dopants can respectively be particles or sheets.

In some embodiments, a particulate dopant 106a is used, such as a gallium (Ga) dopant. Since the particulate dopant 106a is readily volatilized and is in a particulate shape, a waste wafer 108 can be used to cover the silicon material 104 in the region from 0.1 H to 0.3 H described above, and then the dopant 106a can be surrounded and covered by the remainder of the silicon material 104. Moreover, after using the waste wafer 108 to cover the particulate dopant 106a, another sheet dopant 106b (e.g., phosphorus-doped silicon sheet) can be placed thereafter, and then the silicon material 104 can be added. The configuration of the dopants 106a and 106b can be modified according to the form thereof and is not limited to the configurations described above. The effect of reducing volatilization of the dopants 106a and 106b can be achieved as long as the locations of the dopants 106a and 106b are ensured to be in the region of 0.1 H to 0.3 H. Moreover, the waste wafers can also be regarded as a portion of the silicon material 104 for crystal growth.

In an embodiment, the dopants 106a and 106b can include gallium and phosphorous, as long as the placement locations thereof satisfy the above ranges. From the standpoint of achieving concentrated resistance distribution and great quality for the N-type polysilicon crystal, in the dopants 106a and 106b, the doping amount of gallium is such as 0.3 ppma to 3 ppma, and the doping amount of phosphorous is such as 0.02 ppma to 0.2 ppma, and the atomic ratio of gallium with respect to phosphorous is such as in between 10 and 20.

In an embodiment, the crystal growth process of DSS includes configuring the silicon material 104 and the dopants 106a and 106b as shown in FIG. 1, then performing heating to completely melt the silicon material 104 inside the crucible 102 into molten silicon, and then a directional solidification process is performed to cool the crucible 102 and the silicon material 104 inside, such that polysilicon crystal grains are gradually grown along a crystal growth direction V to form an N-type polysilicon crystal.

In the above embodiments, the devices (such as carbon fiber, insulating material, or graphite plate) inside the crystal growth furnace 100 produces a carbon element due to high temperature, and therefore in the case that the crucible opening is not covered by a top cover plate (not shown), the carbon element produced in the environment enters the molten silicon, and as a result the N-type polysilicon crystal manufactured is expected to have a higher carbon content.

According to the preparation method of the first embodiment, the N-type polysilicon crystal grown using DSS has a slope of resistivity and a slope of defect area percentage. When the horizontal axis is referred to solidified fraction and the vertical axis is referred to resistivity presented by unit of Ohm·cm (Ω·cm), the slope of resistivity is 0 to −1.8 at the solidified fraction of 0.25 to 0.8. When the horizontal axis unit is referred to solidified fraction and the vertical axis unit is referred to defect area percentage (%), the slope of defect area percentage is less than 2.5 at the solidified fraction of 0.4 to 0.8.

In the present disclosure, "solidified fraction" in the N-type polysilicon crystal solidification process refers to the ratio of the height of the solidified portion of the N-type polysilicon crystal along the crystal growth direction V thereof with respect to the total height of the silicon crystal. Portions of the crystal being solidified in shorter time has a smaller solidified fraction, while portions of the crystal being solidified in longer time has a greater solidified fraction. As such, a solidified fraction of 0 represents the bottom portion of the N-type polysilicon crystal, while a solidified fraction of 1.0 represents the top portion of the N-type polysilicon crystal.

In an embodiment, the average value of minority carrier lifetime of the N-type polysilicon crystal measured via a µ-PCD method is greater than 20 µs. Moreover, the N-type polysilicon crystal can be doped with gallium and phosphorous, and the doping amount of gallium is such as between 0.3 ppma and 3 ppma, the doping amount of phosphorous is such as between 0.02 ppma and 0.2 ppma, and the atomic ratio of gallium with respect to phosphorous is such as between 10 and 20. For instance, a smaller atomic ratio of gallium with respect to phosphorous indicates a smaller resistivity of the grown N-type polysilicon crystal. On the other hand, a greater atomic ratio of gallium with respect to phosphorous indicates a greater resistivity of the grown N-type polysilicon crystal.

Moreover, the crystal orientations of the above-mentioned N-type polysilicon crystal at least includes {111}, {112}, {113}, {315}, and {115}, but the invention is not limited thereto. Moreover, the N-type polysilicon crystal of the present embodiment has a defect area percentage less than 2% in the solidified fraction range of 0.4 to 0.8. The N-type polysilicon crystal generally includes an ingot, a brick, or a wafer.

The oxygen content of portions of the N-type polysilicon crystal at the solidified fraction of 0 to 0.15 can be greater than or equal to 5 ppma, such as between 5 ppma and 20 ppma, preferably between 5 ppma and 10 ppma. Moreover, since a top cover plate is not used in the crystal growth process, when the oxygen content of the N-type polysilicon crystal is in the range of greater than or equal to 5 ppma, the carbon content at the corresponding location thereof can be greater than or equal to 4 ppma such as between 5 ppma and 20 ppma, preferably between 6 ppma and 13 ppma. Moreover, it can be seen that the average crystal grain size of silicon crystal grains along the crystal growth direction V in the N-type polysilicon crystal and the resistivity of the N-type polysilicon crystal have opposite changing trends. In an embodiment, the average crystal grain size can be less than or equal to 1.3 cm.

Several experiments are provided below to verify the efficacy of the disclosure. However, the scope of the disclosure is not limited to the following experiments.

Experimental Example 1

A silicon material and dopants (gallium particle and phosphorous doping sheet) were placed in a graphite crucible as shown in FIG. 1, and the location of the dopant was in a region of 0.25 H from the bottom portion of the crucible. The doping amount of gallium was 1.953 ppma, and the doping amount of phosphorous was 0.180 ppma. The atomic ratio of gallium with respect to phosphorous was 10.85.

The temperature was raised over 1414° C. without the top cover plate being placed on the crucible, and the silicon material begun to be melted. When heated to 1500° C. to 1570° C., the silicon material was completely melted to a molten silicon, and then crystal growth was performed by controlling the temperature. Initial temperature of crystal growth was set to 1385° C. to 1430° C., and the final temperature was set to 1385° C. to 1400° C. After the crystal growth was complete, annealing and cooling processes were performed in order, and N-type polysilicon crystal can be obtained.

Experimental Example 2

The same crystal growth steps and dopant placement location as experimental example 1 were used, but the doping amounts of gallium and phosphorous were respectively changed to 0.632 ppma and 0.044 ppma. The atomic ratio of gallium with respect to phosphorous was 14.36. An N-type polysilicon crystal can be obtained.

Comparative Example 1

The same crystal growth steps as experimental example 1 were used, except that only boron was doped (doping amount: 0.183 ppma), and therefore a P-type polysilicon crystal was obtained.

Comparative Example 2

Relevant experimental results in "The Potential of Multicrystalline N-Type Silicon for High Efficiency Solar Cells" published in the 29th European PV Solar Energy Conference and Exhibition in Amsterdam, Holland on 22 to 24 Sep. 2014 by Schindler et al. were used as comparative example 2. In particular, the N-type dopant was phosphorous.

Comparative Example 3

Relevant experimental results in pages 1571 to 1579 of "High-Efficiency Multicrystalline Silicon Solar Cells: Potential of n-Type Doping" in IEEE Journal of Photovoltaics, Vol. 5, No. 6 published in November 2015 by Schindler et al. were used as comparative example 3. In particular, the doping amount of the N-type dopant was $7 \times 10^{15}$ cm$^{-3}$ to $8 \times 10^{15}$ cm$^3$, i.e., 0.14 ppma to 0.16 ppma.

<Characterization>

1. Resistivity: a side surface of a polysilicon crystal was detected via a non-contact resistance testing machine, and the average value of the measured values at four sides of the portions of the polysilicon crystal corresponding to each of the solidified fractions can be regarded as the resistivity of the corresponding solidified fraction. The non-contact resistance measurement method included introducing a fixed-frequency alternating current on a transmission coil. When the magnetic field generated by the coil approached a test object, an Eddy current occurred to the test object, and the value of the Eddy current and resistivity were inversely proportional. Accordingly, the resistivity of the test object can be obtained.

2. Minority carrier lifetime of polysilicon crystal: a relationship curve of the minority carrier lifetime of a polysilicon crystal with respect to solidified fraction was measured using a μ-PCD method.

3. Minority carrier lifetime of polysilicon wafer: a polysilicon crystal was cut into a number of wafers in a crystal growth direction (V), and then a minority carrier lifetime testing machine was used to measure the relationship curve between the minority carrier lifetime of the polysilicon wafer and solidified fraction. The thickness of the wafer was not limited as long as it is acceptable for the wafer sorter inside the equipment, and the thicknesses of all test pieces had to be identical.

4. Defect area percentage: a polysilicon crystal was cut into a number of test pieces in a crystal growth direction (V), and then the test pieces were detected using a photoluminescence (PL) machine. As such, light having an energy higher than the energy bandgap of the semiconductor material was irradiated on the test pieces to generate fluorescence emitted by carrier transition and recombination behaviors, and then a defect location was determined according to the fluorescence spectrum via a measurement system to calculate the relationship between defect area percentage and solidified fraction.

5. Carbon content of polysilicon crystal: a polysilicon crystal was cut into a number of test pieces in a crystal growth direction (V), and then the carbon content at nine different locations on each test piece was measured using an FTIR measuring equipment with reference to SEMI MF 1391-0704 standard measurement specifications, and lastly an average value of the individual carbon content at the nine locations on the test piece was calculated, and the total average value from five repeated measurements was used as the carbon content of the test piece.

6. Oxygen content of polysilicon crystal: same as the measuring method of carbon content above.

7. Average crystal grain size: a polysilicon crystal was cut into a number of test pieces in the crystal growth direction (V), and then the relationship between average crystal grain size and solidified fraction was measured according to the ASTM E112-10 standard measurement specification.

Figure 2:
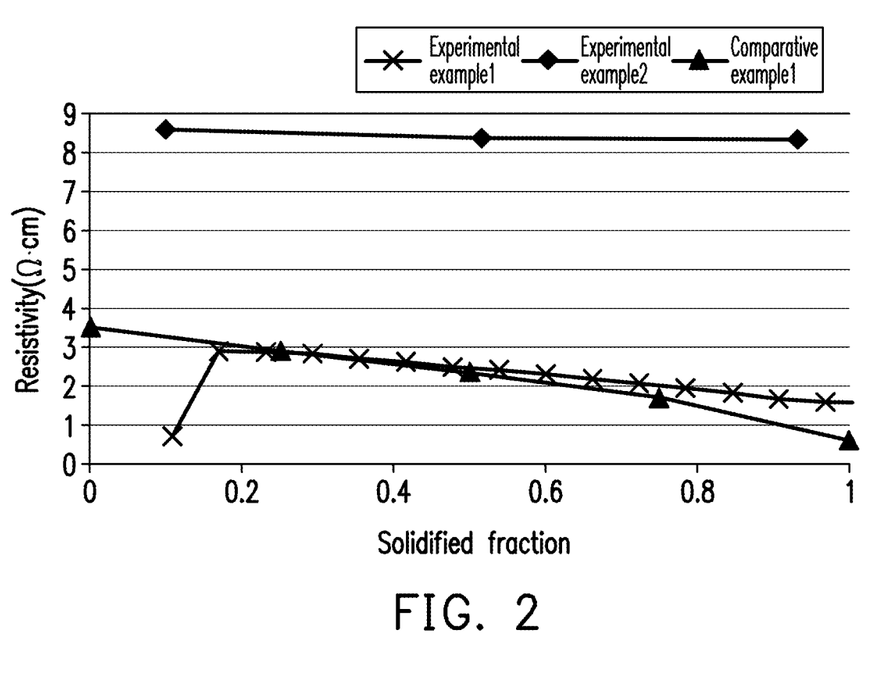
FIG. 2 is a line diagram illustrating a relationship of resistivity with respect to solidified fraction of the polysilicon crystals of experimental examples 1 to 2 and comparative example 2.

First, a measurement of resistivity was performed on the polysilicon crystals of experimental examples 1 to 2 according to the characterization method above, and the results are shown together with the data of comparative example 2 in FIG. 2. It can be seen from FIG. 2 that, the resistivity of experimental example 1 is between 1.5 Ω·cm and 3 Ω·cm, the resistivity of experimental example 2 is between 8 Ω·cm and 9 Ω·cm, and the resistivity of comparative example 2 is between 0.5 Ω·cm and 3.5 Ω·cm. If the horizontal axis is referred to solidified fraction and the vertical axis is referred to resistivity presented by unit of Ohm·cm (Ω·cm), then at the solidified fraction of 0.25 to 0.8, the slope of resistivity of experimental example 1 is −1.63, the slope of resistivity of experimental example 2 is about −0.3, and the slope of resistivity of comparative example 2 is less than −1.8, and is −2.5. Therefore, in comparison to the N-type polysilicon crystal of comparative example 2, the range of resistivity of experimental examples 1 to 2 is more concentrated than in comparative example 2, i.e., the slopes of resistivity of experimental examples 1 to 2 are gentler.

Figure 3:
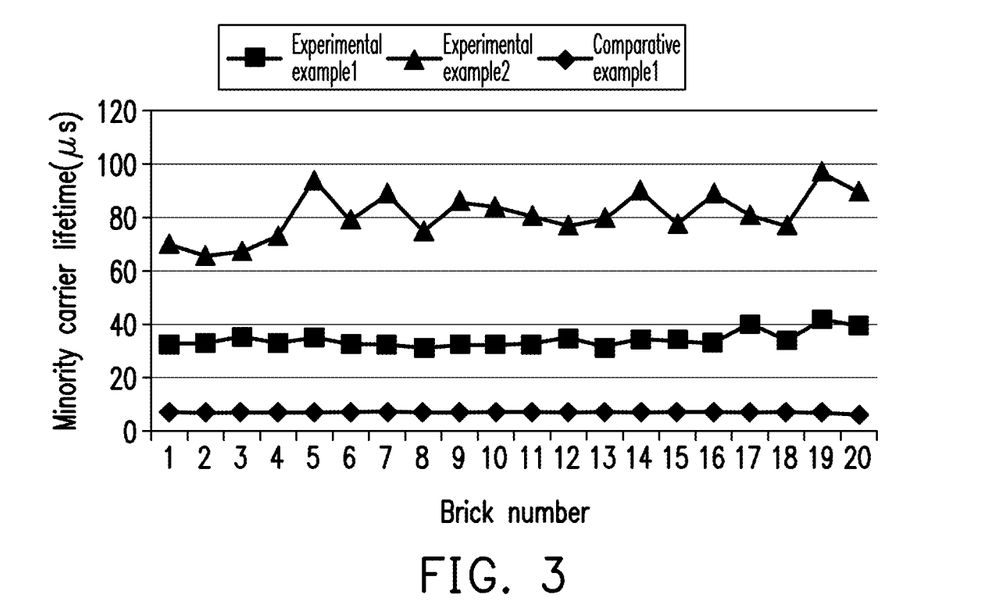
FIG. 3 is a line diagram illustrating minority carrier lifetime of the polysilicon crystal of experimental examples 1 to 2 and comparative example 1.

Next, a measurement of minority carrier lifetime was performed on the polysilicon crystals of experimental examples 1 to 2 and comparative example 1, and the results are shown in FIG. 3. It can be seen from FIG. 3 that, the crystal minority carrier lifetimes of experimental examples 1 to 2 are both 20 μs or greater, and the maximum value of the crystal minority carrier lifetime of experimental example 1 reaches 40 μs or more. In comparison, the minority carrier lifetime of the P-type polysilicon crystal of comparative example 1 is less than 10 μs.

Figure 4:
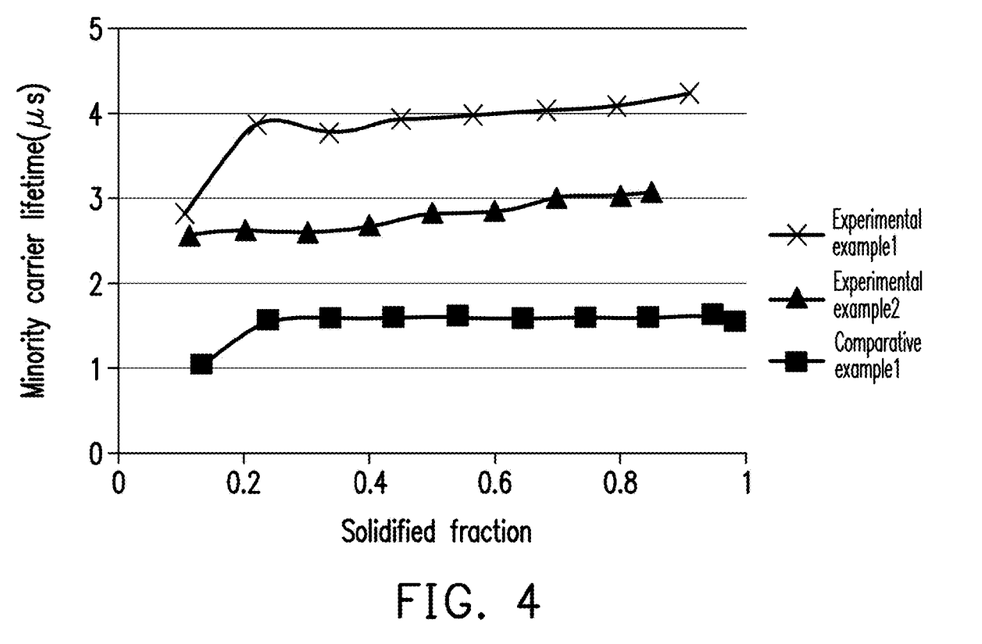
FIG. 4 is a line diagram illustrating minority carrier lifetime of polysilicon wafers prepared by the polysilicon crystals of experimental examples 1 to 2 and comparative example 1.

The results of the minority carrier lifetimes of the polysilicon wafers of experimental examples 1 to 2 and comparative example 1 are shown in FIG. 4. It can be obtained from FIG. 4 that, the wafer minority carrier lifetime of experimental example 1 is 3 μs to 4.2 μs, and the wafer minority carrier lifetime of experimental example 2 is 2.5 μs to 3 μs. In comparison, the P-type polysilicon wafer minority carrier lifetime of comparative example 1 is about 1.6 μs. Therefore, the average value of the minority carrier lifetime of experimental examples 1 to 2 of the invention is in the range of 2 μs to 5 μs, and therefore a longer wafer minority carrier lifetime than comparative example 1 is achieved.

Figure 5:
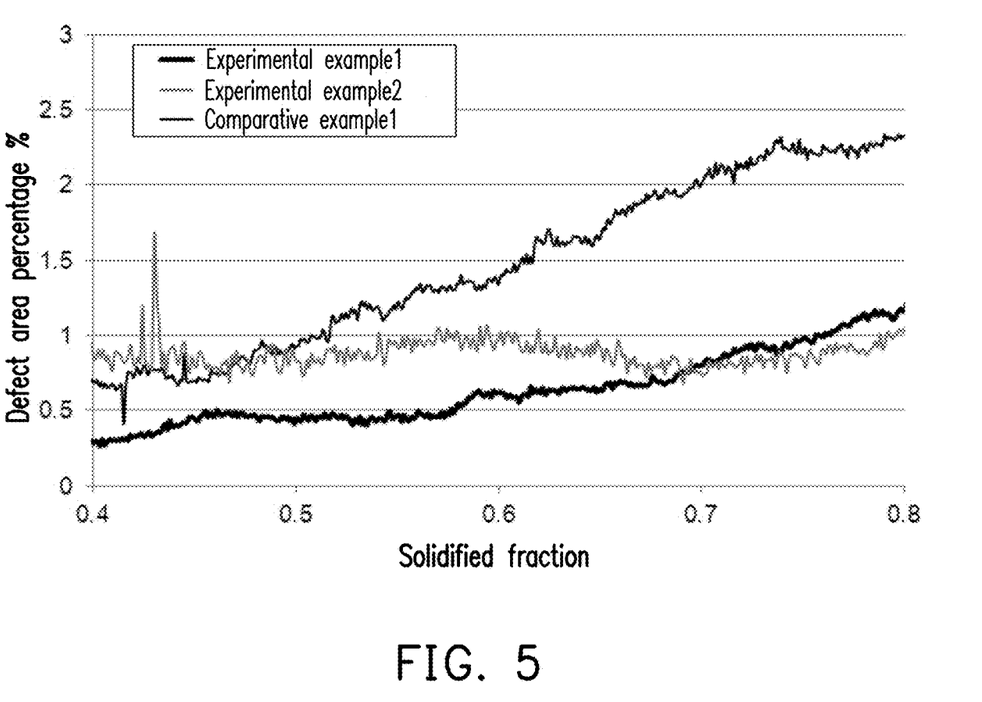
FIG. 5 is a line diagram illustrating relationship of defect area percentage with respect to solidified fraction of polysilicon wafers prepared by the polysilicon crystals of experimental examples 1 to 2 and comparative example 1.

Next, a defect measurement was performed on the polysilicon wafers of experimental examples 1 to 2 and comparative example 1, and the results are shown in FIG. 5. It can be seen from FIG. 5 that, in experimental examples 1 to 2 with the solidified fraction of 0.4 to 0.8, the defect area percentages are both less than 2%, and the average defect area percentage is less than 1.5%. In comparison, the defect area percentage of comparative example 1 reaches about 2.5%. When the horizontal axis is referred to solidified fraction and the vertical axis is referred to defect area percentage (%), the slope of defect area percentage of experimental example 1 at the solidified fraction of 0.4 to 0.8 is about 2.25, and the slope of defect area percentage of experimental example 2 at the solidified fraction of 0.4 to 0.8 is about 0.25. Therefore, the slopes of defect area percentage of experimental examples 1 to 2 of the invention are both less than 2.5. In comparison, in comparative example 1 with the solidified fraction of 0.4 to 0.8, the slope of defect area percentage is about 4. Therefore, in comparison to the P-type polysilicon crystal of comparative example 1, the defect area percentages of experimental examples 1 to 2 are less, and the slopes of defect area percentage are gentler (smaller), and therefore the overall brick quality is better than the P-type polysilicon crystal of comparative example 1.

Figure 6:
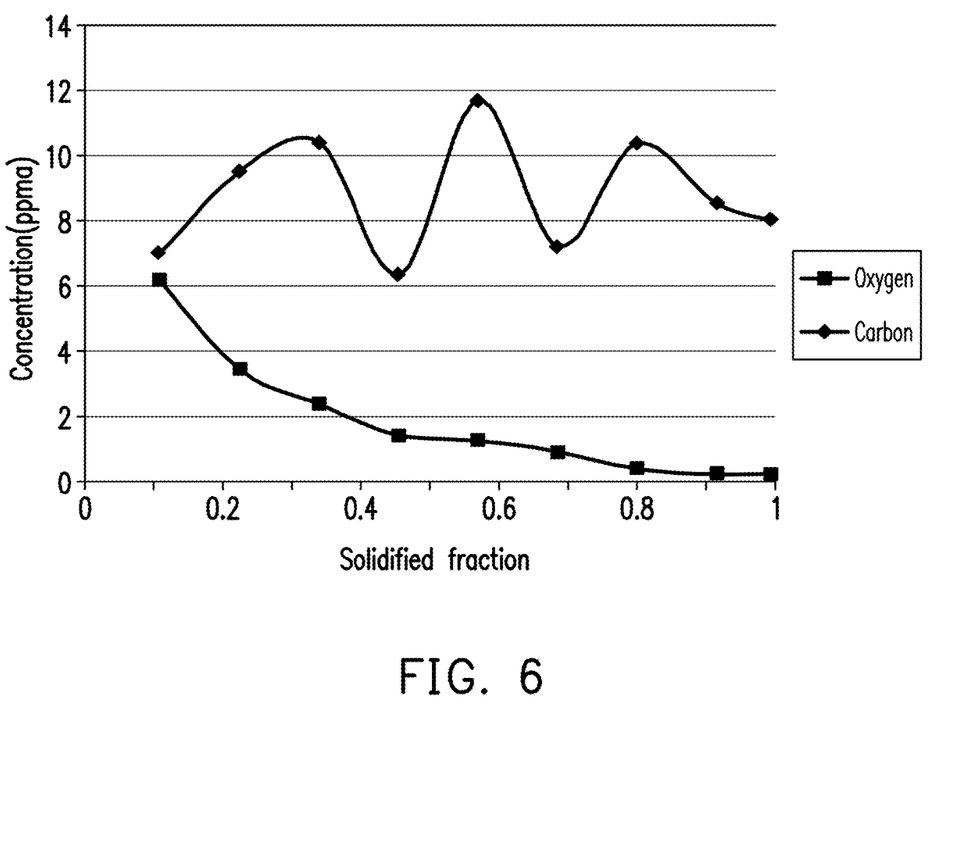
FIG. 6 is a line diagram illustrating relationship of carbon/oxygen content with respect to solidified fraction of the polysilicon column of experimental example 1.

The results of the carbon content and the oxygen content of the polysilicon column are shown in FIG. 6 and Table 1 below.

TABLE 1

| Solidified fraction | Oxygen content (ppma) | Carbon content (ppma) |
| --- | --- | --- |
| 0.11 | 6.172 | 7.015 |
| 0.22 | 3.44 | 9.518 |
| 0.34 | 2.379 | 10.388 |
| 0.46 | 1.442 | 6.351 |
| 0.57 | 1.274 | 11.699 |
| 0.69 | 0.917 | 7.244 |
| 0.80 | 0.407 | 10.362 |
| 0.92 | 0.244 | 8.539 |
| 1.00 | 0.238 | 8.035 |

It can be seen from FIG. 6 and Table 1 that, the carbon content of the N-type polysilicon crystal of experimental 1 is greater than 4 ppma when the oxygen content thereof is greater than 5 ppma. Moreover, it can be seen from FIG. 6 that the oxygen content has a reverse changing trend in the crystal growth direction (V). That is, in the crystal growth direction V, portions of the crystal being solidified in shorter time (i.e., being solidified sooner) has higher oxygen content, and portions of the crystal being solidified in longer time (i.e., being solidified later) has lower oxygen content. In other words, a higher solidified fraction indicates lower oxygen content.

Figure 7:
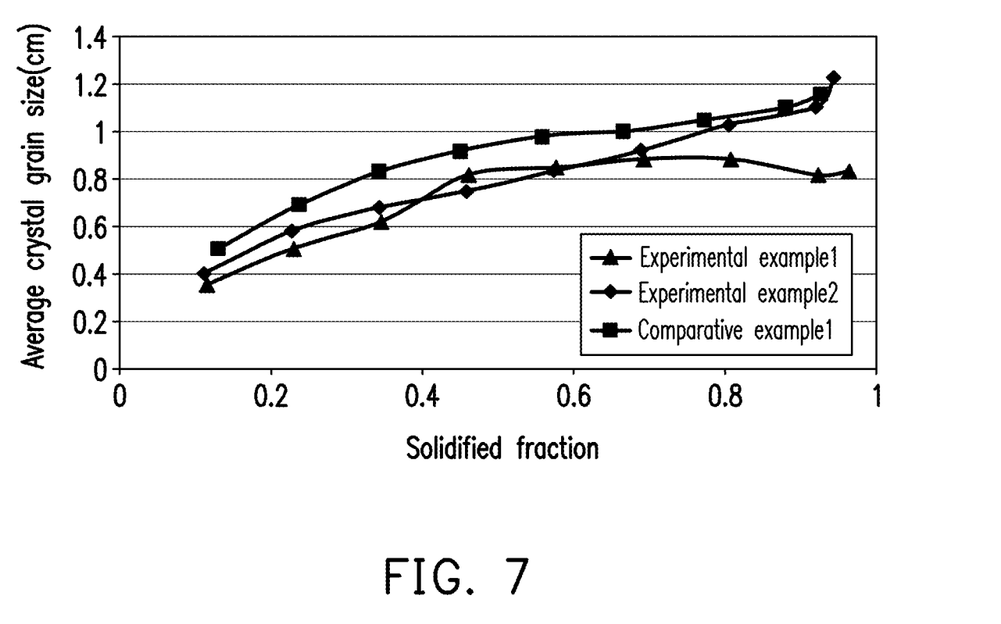
FIG. 7 is a line diagram illustrating relationship of average crystal grain size with respect to solidified fraction of the polysilicon crystals of experimental examples 1 to 2 and comparative example 1.

Lastly, measurement of particle size was performed on experimental examples 1 to 2 and comparative example 1, and the results are shown in FIG. 7. It can be seen from FIG. 7 that, the average crystal grain sizes of silicon crystal grains in the crystal growth direction of experimental examples 1 to 2 and comparative example 1 are all less than 1.3 cm, and as the solidified fraction is increased, the crystal grain size tends to be increased. Therefore, referring to the results of resistivity described above, a conclusion that the average crystal grain size of silicon crystal grains in the crystal growth direction V and the resistivity of the N-type polysilicon crystal have opposite changing trends can be drawn.

Application Example

The N-type polysilicon wafers formed by cutting the N-type polysilicon crystals of experimental example 1 and comparative example 1 were made into solar cells for testing via the same solar cell manufacturing process in the literature of comparative example 3. The solar cell manufacturing process includes: (1) performing an etching (or texturing) process on a front surface of the wafer; (2) performing a masking process shielding the back surface of the wafer; (3) performing a boron diffusion process (890° C.; 1 hour); (4) performing a step of removing the mask on the back surface of the wafer; (5) performing a step of forming a tunnel oxide layer of about several Angstroms on the back surface of the wafer; (6) performing a step of depositing a 15 nm-thick phosphorous-doped silicon layer on the tunnel oxide layer; (7) performing an annealing process (800° C.; 1 hour); (8) performing a passivation treatment on the front surface of the wafer; and (9) performing a metallization process.

Figure 8:
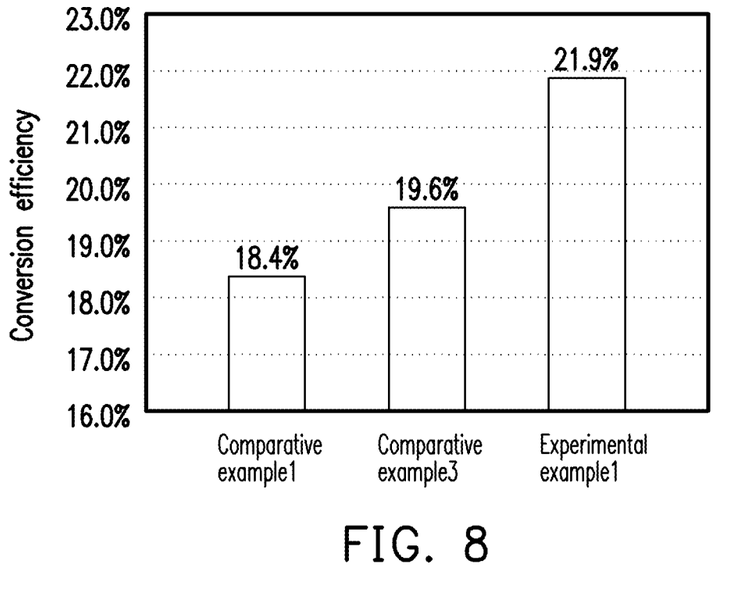
FIG. 8 is a comparison chart illustrating conversion efficiency of solar cells applying polysilicon wafers prepared by the polysilicon crystals of experimental example 1, comparative example 1, and comparative example 3.

Next, I-V measurement was performed on the solar cells for testing, and the results are shown together with the conversion efficiency in the literature of comparative example 3 in FIG. 8. It can be seen from FIG. 8 that, the N-type polysilicon wafer of experimental example 1 of the invention has a conversion efficiency reaching 21.9% which is significantly better than the results of 18.4% of the P-type polysilicon wafer of comparative example 1 and 19.6% of the N-type polysilicon wafer of comparative example 3. Therefore, it can be known that the quality of the N-type polysilicon wafer of experimental example 1 is better than that of the N-type polysilicon wafer of comparative example 3.

Based on the above, the N-type polysilicon crystal of the invention has a gentler slope of resistivity and slope of defect area percentage, and the minority carrier lifetime is also increased. Therefore, great crystal quality can be achieved, and a solar cell having good conversion efficiency can be manufactured from such N-type polysilicon crystal. Moreover, in the invention, during the process of growing the N-type polysilicon crystal by a DSS crystal growth furnace, the dopant can be placed in a region of a specific range, so as to manufacture the N-type polysilicon crystal having concentrated resistance distribution and great quality described above.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An N-type polysilicon crystal, wherein:
a resistivity of the N-type polysilicon crystal has a slope when graphed, of which a horizontal axis is referred to as a solidification fraction and a vertical axis is referred to as the resistivity presented by a unit of Ohm-cm ($\Omega$·cm), and the slope of resistivity is between 0 to −1.8 at a first solidification fraction value between 0.25 to 0.8; and
a defect area percentage of the N-type polysilicon crystal has a slope when graphed, of which the horizontal axis is referred to as the solidification fraction and the vertical axis is referred to as the defect area percentage (%), and the slope of defect area percentage is less than 2.5 at a second solidification fraction value between 0.4 to 0.8.

2. The N-type polysilicon crystal of claim 1, wherein an average value of a minority carrier lifetime of the N-type polysilicon crystal measured via a μ-PCD method is greater than 20 μs.

3. The N-type polysilicon crystal of claim 1, wherein the N-type polysilicon crystal is doped with gallium and phosphorous, a doping amount of the gallium is 0.3 ppma to 3 ppma, a doping amount of the phosphorous is 0.02 ppma to 0.2 ppma, and an atomic ratio of the gallium with respect to the phosphorous is between 10 and 20.

4. The N-type polysilicon crystal of claim 1, wherein the N-type polysilicon crystal comprises an ingot, a brick, or a wafer.

5. The N-type polysilicon crystal of claim 1, wherein a crystal orientation of the N-type polysilicon crystal at least comprises {111}, {112}, {113}, {315}, and {115}.

6. The N-type polysilicon crystal of claim 1, wherein the defect area percentage of the N-type polysilicon crystal is less than 2% at the solidified fraction of 0.4 to 0.8.

7. The N-type polysilicon crystal of claim 1, wherein when an oxygen content in the N-type polysilicon crystal is in a range of greater than or equal to 5 ppma, a carbon content of a corresponding location thereof is greater than or equal to 4 ppma.

8. The N-type polysilicon crystal of claim 7, wherein the N-type polysilicon crystal comprises a plurality of silicon crystal grains grown along a crystal growth direction, wherein an average crystal grain size of the silicon crystal grains in the crystal growth direction and a resistivity of the N-type polysilicon crystal have opposite changing trends.

9. The N-type polysilicon crystal of claim 8, wherein the average crystal grain size is less than or equal to 1.3 cm.

10. An N-type polysilicon wafer obtained by cutting the N-type polysilicon crystal of claim 1, wherein an average value of a minority carrier lifetime of the N-type polysilicon wafer measured via a μ-PCD method is 2 μs to 5 μs.

* * * * *